(12) United States Patent
Chang

(10) Patent No.: US 7,026,106 B2
(45) Date of Patent: Apr. 11, 2006

(54) EXPOSURE METHOD FOR THE CONTACT HOLE

(75) Inventor: Chung-Hsing Chang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 309 days.

(21) Appl. No.: 10/410,123

(22) Filed: Apr. 9, 2003

(65) Prior Publication Data

US 2004/0202963 A1 Oct. 14, 2004

(51) Int. Cl.
*G03C 5/00* (2006.01)

(52) U.S. Cl. ............................ 430/394; 430/311; 430/5

(58) Field of Classification Search ................ 430/394, 430/311, 5
See application file for complete search history.

(56) References Cited

U.S. PATENT DOCUMENTS

| | | | |
|---|---|---|---|
| 5,308,741 A | 5/1994 | Kemp | 430/312 |
| 5,422,205 A | 6/1995 | Inoue et al. | 430/5 |
| 5,455,144 A | 10/1995 | Okamoto et al. | 430/313 |
| 5,635,316 A * | 6/1997 | Dao | 430/5 |
| 5,702,868 A | 12/1997 | Kellam et al. | 430/312 |
| 5,863,712 A | 1/1999 | Von Bunau et al. | 430/396 |
| 5,958,656 A | 9/1999 | Nakao | 430/394 |
| 6,022,644 A | 2/2000 | Lin et al. | 430/5 |
| 6,184,151 B1 | 2/2001 | Adair et al. | 438/743 |
| 6,238,850 B1 | 5/2001 | Bula et al. | 430/394 |
| 2003/0039893 A1 * | 2/2003 | Farnsworth et al. | 430/5 |
| 2004/0259042 A1 * | 12/2004 | Fritze et al. | 430/394 |

* cited by examiner

*Primary Examiner*—John A. McPherson
*Assistant Examiner*—Daborah Chacko-Davis
(74) *Attorney, Agent, or Firm*—Thomas, Kayden, Horstemeyer & Risley

(57) ABSTRACT

A method of forming contact holes in either a positive radiation sensitive layer, such as positive photoresist, or a negative radiation sensitive layer, such as negative photoresist, using three exposures is described. The sum of the three exposure doses is equal to that required to expose the entire radiation sensitive layer. The allowable contact hole locations are at the intersection of a first array of parallel regularly spaced lines and a second array of parallel regularly spaced lines. The lines are exposed in two separate exposures. For the positive radiation sensitive layer the contact holes are partially exposed by these exposures. For the negative radiation sensitive layer the contact holes remain unexposed by these exposures. The third exposure uses a pattern mask to either fully expose the contact holes in the positive radiation sensitive layer or leave them unexposed in the negative radiation sensitive layer. The radiation sensitive layer is then developed and the contact holes are formed.

17 Claims, 10 Drawing Sheets

EXPOSURE METHOD FOR THE CONTACT HOLE

BACKGROUND OF THE INVENTION (1) Field of the Invention

This invention relates to methods of forming small contact holes using triple exposure of either a positive radiation sensitive layer or a negative radiation sensitive layer.

(2) Description of the Related Art

U.S. Pat. No. 5,863,712 to Von Bunau et al. describes a method of forming a projected image or photosensitive dielectric pattern that is faithful to a designed pattern without performing complex correction of a mask pattern.

U.S. Pat. No. 5,958,656 to Nakao describes a pattern forming method using a first exposure using a first phase shift mask and a second exposure using a second phase shift mask.

U.S. Pat. No. 5,455,144 to Okamoto et al. describes an exposure technology for a semiconductor integrated circuit device which has a pattern as fine as that of an exposure wavelength.

U.S. Pat. No. 6,022,644 to Lin et al. describes a mask containing a subresolution line to minimize proximity effect of a contact hole.

U.S. Pat. No. 5,308,741 to Kemp describes a lithographic method using double exposures, physical mask shifting, and light phase shifting to form masking features on a substrate masking layer.

U.S. Pat. No. 6,238,850 B1 to Bula et al. describes a method of forming an image having reduced corner rounding in a photosensitive dielectric layer.

U.S. Pat. No. 5,702,868 to Kellam et al. describes a method of fabricating a plurality of high resolution images in a radiation sensitive material.

U.S. Pat. No. 6,184,151 B1 to Adair et al. describes a method of forming square shape images in a lithographic process.

U.S. Pat. No. 5,422,205 to Inoue et al. describes a method of transferring a micropatttern onto a substrate. The method comprises forming a multilayer film consisting of at least two layers on the substrate. The uppermost layer is exposed using a first mask. The layers other than the uppermost layer are exposed using a second mask.

SUMMARY OF THE INVENTION

Contact holes are required for semiconductor integrated circuit fabrication. As the size of the required contact holes continues to decrease the process window for contact hole formation becomes smaller. In the fabrication of contact holes it is highly desirable to improve the contact hole process window in order to improve manufacturing wafer yields.

It is a principle objective of this invention to provide a method of forming contact holes in a positive radiation sensitive layer which has an improved process window.

It is another principle objective of this invention to provide a method of forming contact holes in a negative radiation sensitive layer which has an improved process window.

These objectives are achieved by using a triple exposure method to form the contact holes. The allowable contact hole locations are the intersection points formed by the intersection of a first array of parallel regularly spaced lines with a second array of parallel regularly spaced lines.

In the case of forming contact holes in a positive radiation sensitive layer, such as positive photoresist, a first array of parallel regularly spaced lines are exposed in the positive radiation sensitive layer using an exposure dose one third that required to expose the entire positive radiation sensitive layer. This exposure step uses a projection lithography system and either binary masks, chrome-less phase shifting masks, attenuating phase shifting masks with off-axis illumination, attenuating phase shifting masks with conventional on-axis illumination or two beam interference. In a separate exposure step a second array of parallel regularly spaced lines are exposed in the positive radiation sensitive layer using an exposure dose one third that required to expose the entire positive radiation sensitive layer. This exposure step uses a projection lithography system and either binary masks, chrome-less phase shifting masks, attenuating phase shifting masks with off-axis illumination, attenuating phase shifting masks with conventional on-axis illumination or two beam interference.

The regions of the positive radiation sensitive layer at the desired locations of the contact holes, the intersection points formed by the first array of parallel regularly spaced lines intersecting the second array of parallel regularly spaced lines, are exposed in a separate exposure step using an exposure dose one third that required to expose the entire positive radiation sensitive layer. This exposure uses a projection lithography system and a binary mask. The positive radiation sensitive layer is then developed to form the contact holes.

In the case of forming contact holes in a negative radiation sensitive layer, such as negative photoresist, that part of the negative radiation sensitive layer except a first series of parallel regularly spaced lines are exposed using an exposure dose one third that required to expose the entire negative radiation sensitive layer. This exposure uses a projection lithography system and either binary masks, phase shifting masks, or attenuating phase shifting masks. In a separate exposure step that part of the negative radiation sensitive layer except a second series of parallel regularly spaced lines are exposed using an exposure dose one third that required to expose the entire negative radiation sensitive layer. This exposure also uses a projection lithography system and either binary masks, phase shifting masks, or attenuating phase shifting masks.

In a separate exposure step the negative radiation sensitive layer except the regions of the negative radiation sensitive layer at the locations of the contact holes, the intersection points formed by the first array of parallel regularly spaced lines intersecting the second array of parallel regularly spaced lines, are exposed using an exposure dose of two thirds of that required to expose the entire negative radiation sensitive layer. This exposure uses a projection lithography system and a binary mask. The negative radiation sensitive layer is then developed to form the contact holes.

DESCRIPTION OF THE PREFERRED EMBODIMENTS

Figure 1A:
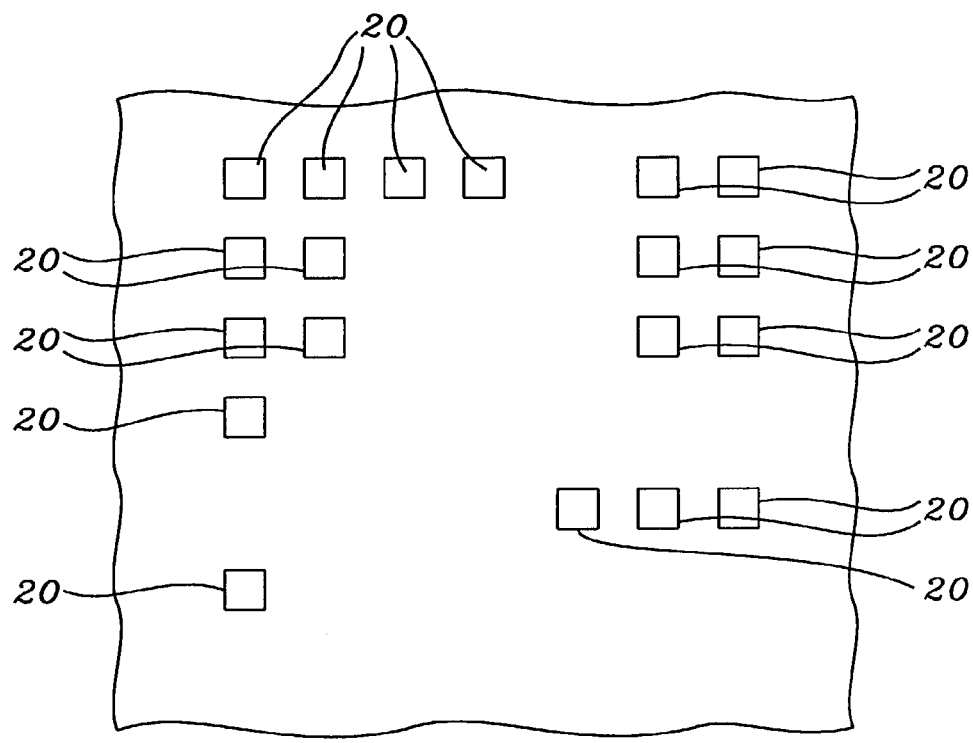
FIG. 1A shows a top view of a contact hole pattern to be formed in a positive or a negative radiation sensitive layer.

Refer now to FIGS. 1A–8 and 13–15 for a preferred embodiment of the method of forming contact holes of this invention. FIG. 1A shows a top view of a pattern of contact holes 20 which is to be formed in a radiation sensitive layer, such as photoresist. The contact holes 20 are typically square and are arranged in a regular array, typically an array of horizontal and vertical lines. FIG. 1B shows a top view and FIG. 1C a cross section view of a radiation sensitive layer 34 formed on a substrate 38. In this first embodiment the radiation sensitive layer 34 is a positive radiation sensitive layer, such as positive photoresist. The substrate 38 typically is a semiconductor integrated circuit wafer having devices formed therein.

Figure 2:
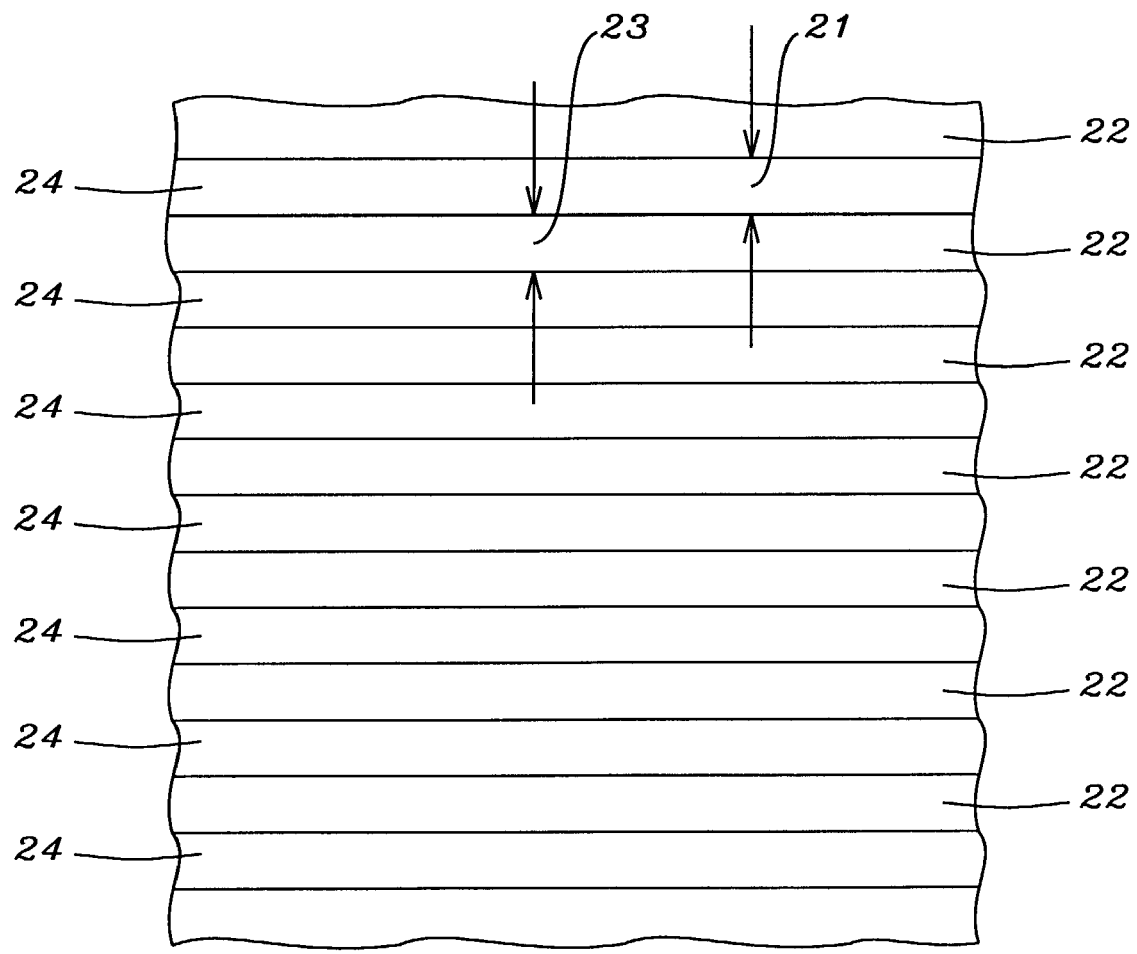
FIG. 2 shows a pattern of a first array of parallel regularly spaced lines used in forming contact holes in a positive radiation sensitive layer.

The method of this invention comprises three exposure steps which will be described in a particular sequence. However, the three exposure steps to be described can be carried out in any sequence. A first exposure step is to expose a first array of parallel regularly spaced lines, typically a number of horizontal lines, in the positive radiation sensitive layer using a first exposure dose, wherein the first exposure dose is less than that required to expose the entire thickness of the positive radiation sensitive layer. In this example the first exposure dose is one third the exposure dose required to expose the entire thickness of the positive radiation sensitive layer. FIG. 2 shows the results of the first exposure, wherein first lines 24 show the regions of the positive radiation sensitive layer exposed during the first exposure and second lines 22 show the regions of the positive radiation sensitive layer which remain unexposed during the first exposure. In the first exposure the width 21 of the exposed first lines 24 in the positive radiation sensitive layer is a first width. The spacing 23 between adjacent exposed first lines 24 in the positive radiation sensitive layer is also the first width. In this example the first width is between about 100 and 140 nanometers.

In the first exposure one of the exposed first lines 24 covers the desired location of each of the contact holes to be formed in the positive radiation sensitive layer. Thus, in the first exposure, the positive radiation sensitive layer at the desired location of each of the contact holes is exposed with a first exposure dose. In this example the first exposure dose is one third that required to expose the entire positive radiation sensitive layer.

Figure 3:
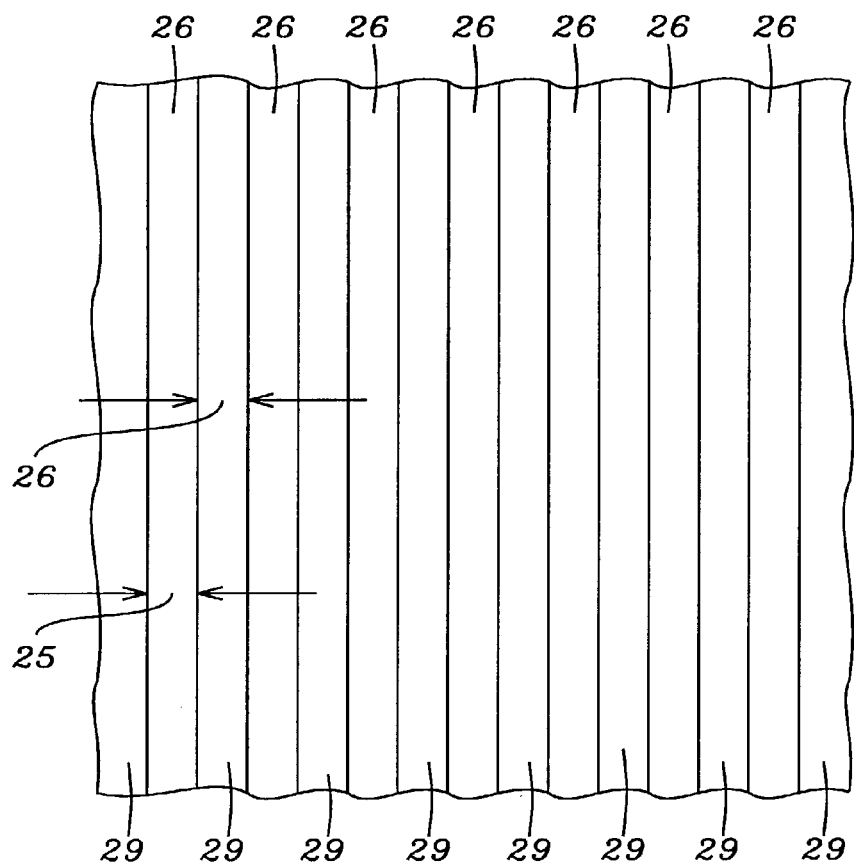
FIG. 3 shows a second array of parallel regularly spaced lines used in forming contact holes in a positive radiation sensitive layer.

A second exposure step is to expose a second array of parallel regularly spaced lines in the positive radiation sensitive layer using a second exposure dose wherein the second exposure dose is less than that required to expose the entire thickness of the positive radiation sensitive layer. In this example the second exposure dose is one third that required to expose the entire thickness of the positive radiation sensitive layer. The horizontal lines in the first exposure and the vertical lines in the second exposure are perpendicular. FIG. 3 shows the results of the second exposure, wherein third lines 26 show the exposed regions in the positive radiation sensitive layer and fourth lines 29 show the regions of the positive radiation sensitive layer which remain unexposed during the second exposure. In the second exposure the width 25 of the exposed third lines 26 in the positive radiation sensitive layer is a second width. The spacing 27 between adjacent exposed third lines 26 in the positive radiation sensitive layer is also the second width. Typically, but not necessarily, the first width and the second width are the same. In this example the second width is between about 100 and 140 nanometers.

The first lines 24 of the first array of parallel regularly spaced lines and the third lines 26 of the second array of parallel regularly spaced lines intersect forming a number of intersection points corresponding to the desired location of the contact holes. Thus, in the second exposure one of the third lines 26 covers the desired location of each of the contact holes to be formed in the positive radiation sensitive layer. Thus, in the second exposure, the positive radiation sensitive layer at the desired location of each of the contact holes is exposed with a second exposure dose. In this example the second exposure dose is one third that required to expose the entire positive radiation sensitive layer.

Figure 4:
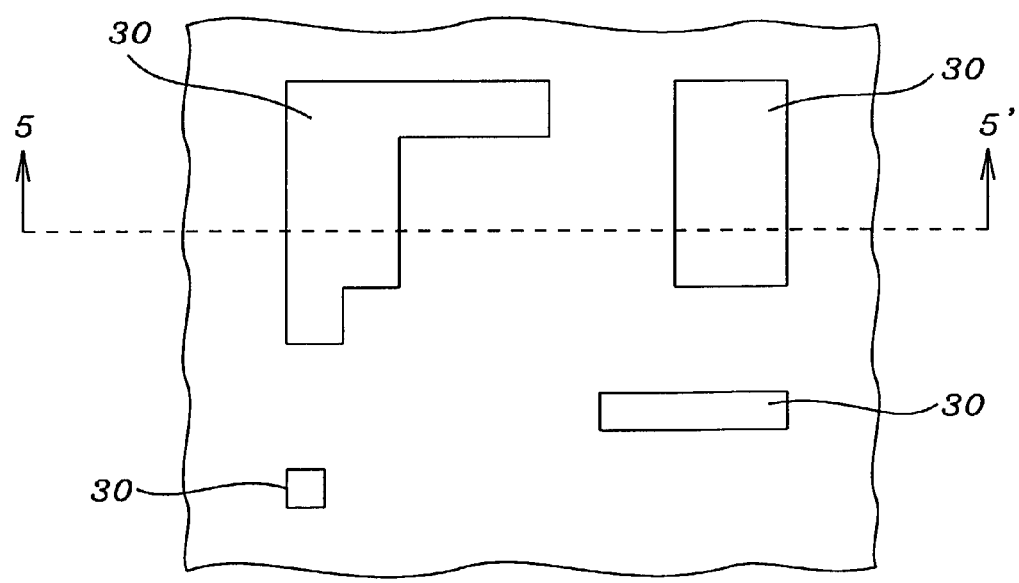
FIG. 4 shows the top view of the binary mask used in the third exposure in forming contact holes in a positive radiation sensitive layer.
Figure 5:
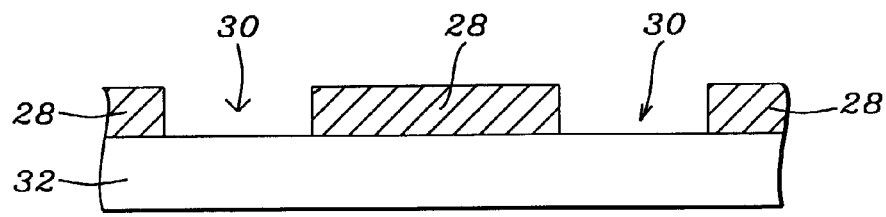
FIG. 5 shows a cross section of the mask of FIG. 4 taken along line 5—5' of FIG. 4.

A third exposure step is to expose the positive radiation sensitive layer at the desired location of each contact hole using a third exposure dose wherein the third exposure dose is less than the exposure dose required to expose the entire thickness of the positive radiation sensitive layer. In this example the third exposure dose is one third the exposure dose required to expose the entire thickness of the positive radiation sensitive layer and the first second and third exposure doses are equal. The dimensional control for the third exposure is not critical and a binary mask can be used. FIG. 4 shows the top view of a binary mask used for the third exposure showing transparent regions 30 used to expose the positive radiation sensitive layer at the desired location of each contact hole and an opaque region 28 used to prevent exposure over the remaining area of the positive radiation sensitive layer. FIG. 5 shows a cross section of the mask used in the third exposure taken along line 5—5' of FIG. 4. As shown in FIG. 5 opaque material 28, such as chrome, is formed on a transparent mask substrate 32. In the third exposure the positive radiation sensitive layer at the desired location of each of the contact holes is exposed with a third exposure dose. In this example the third exposure dose is one third that required to expose the entire positive radiation sensitive layer. The sum of the first second and third exposure doses is equal to the exposure dose required to expose the entire thickness of the positive radiation sensitive layer.

Prior to the third exposure the desired location of the contact holes have received the sum of the first and second exposure doses and the remaining regions have received either no exposure, the first exposure dose, or the second exposure dose. The third exposure step provides the remaining exposure dose required to expose the entire thickness of the positive radiation sensitive layer at the desired location of the contact holes. The three exposures expose the positive radiation sensitive layer at the desired location of each of the contact holes with the exposure dose required to expose the entire positive radiation sensitive layer. Every other region of the layer of radiation sensitive layer receives either no exposure, the first exposure dose, or the second exposure dose. Since the regions immediately surrounding the desired location of each contact hole have received either no exposure, the first exposure dose, or the second exposure dose it is not critical if part of these regions surrounding the desired location of each contact hole receive the third exposure dose since these regions will receive less than the dose required to expose the positive radiation sensitive layer and the regions immediately surrounding the desired location of each contact hole will not be totally exposed. Because of this, the dimensional control for the third mask used in the third exposure dose is not critical. The first, second, and third exposures can be preformed in any order. The positive radiation sensitive layer can be a positive photoresist.

Figure 6:
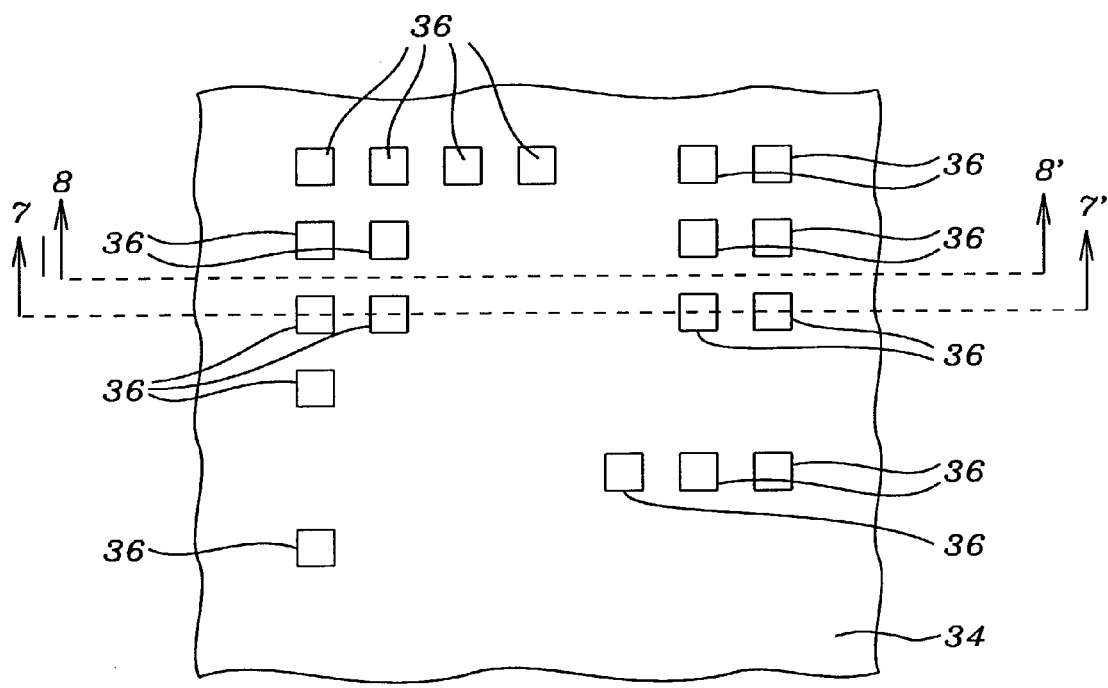
FIG. 6 shows a top view of the exposed and developed positive or negative radiation sensitive layer having contact holes formed therein.
Figure 7:
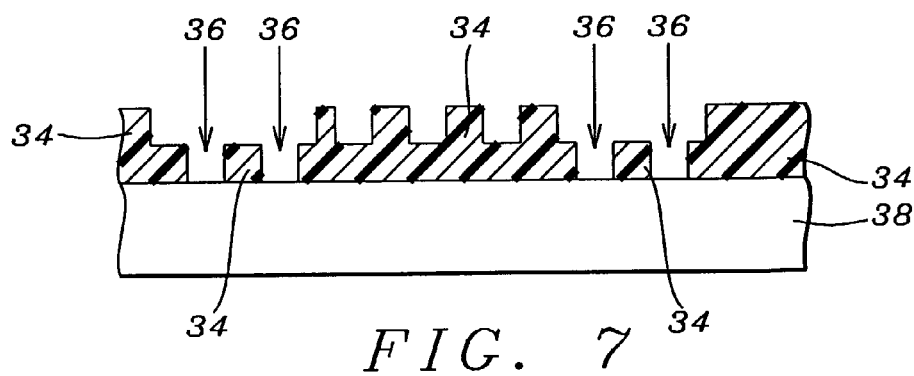
FIG. 7 shows a cross section view of the developed positive negative radiation sensitive layer of FIG. 6 taken along line 7—7' of FIG. 6.
Figure 8:
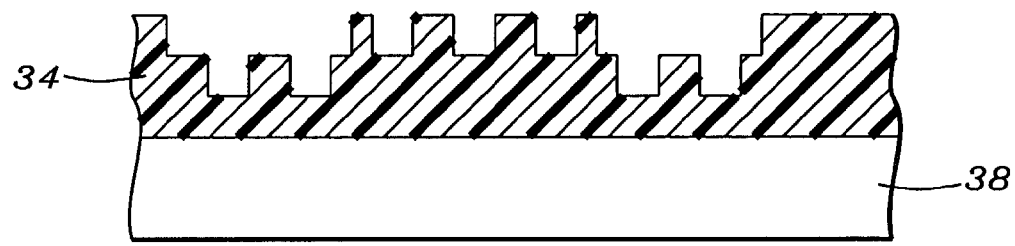
FIG. 8 shows a cross section view of the developed positive or negative radiation sensitive layer of FIG. 6 taken along line 8—8' of FIG. 6.

As shown in FIG. 6, the positive radiation sensitive layer 34 is then developed to form the contact holes 36. FIGS. 7 and 8 show cross sections of the substrate 38 and the positive radiation sensitive layer 34 after the positive radiation sensitive layer has been developed and the contact holes 36 have been formed. FIG. 7 is a cross section view taken along line 7—7' of FIG. 6. FIG. 8 is a cross section view taken along line 8—8' of FIG. 6. For this example where the first, second, and third exposure doses are equal, FIGS. 7 and 8 show regions of the positive radiation sensitive layer 34 that have received no exposure, one third that required to expose the entire thickness of the layer of radiation sensitive layer, two thirds that required to expose the entire thickness of the radiation sensitive layer, or an exposure dose sufficient to expose the entire positive radiation sensitive layer and form the contact holes 36.

Figure 13:
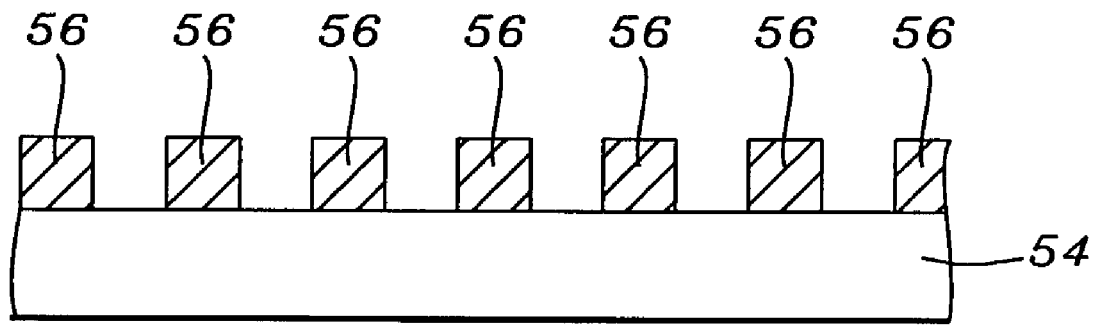
FIG. 13 shows a cross section view of a binary mask used to expose the pattern having a first array of parallel regularly spaced or the pattern having a second array of parallel regularly spaced lines in a positive or a negative radiation sensitive layer.

The masks used to form first array of parallel regularly spaced lines using first exposure and the second array of parallel regularly spaced lines using the second exposure can be binary masks, chrome-less phase shifting masks, attenuating phase shifting masks using off-axis illumination, attenuating phase shifting masks with conventional on-axis illumination or two beam interference. FIG. 13 shows a cross section view of a binary mask used in the first and second exposures showing regularly spaced opaque lines 56 on a transparent mask substrate 54. The opaque lines 56 can be formed of an opaque material such as chrome.

Figure 14:
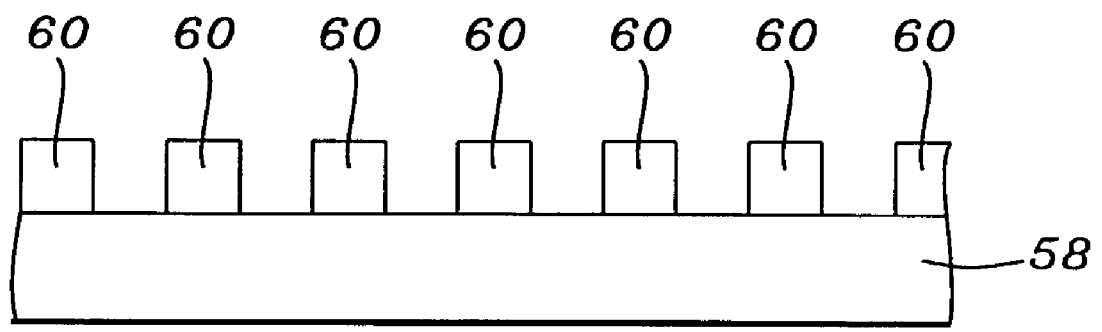
FIG. 14 shows a cross section view of a phase shifting mask or an attenuating phase shifting mask used to expose the pattern having a first array of parallel regularly spaced or the pattern having a second array of parallel regularly spaced lines in a positive or a negative radiation sensitive layer.

FIG. 14 shows a cross section view of a phase shifting mask or an attenuating phase shifting mask. For these masks regularly spaced lines of phase shifting or attenuating phase shifting material 60 are formed on a transparent mask substrate 58. The lines of phase shifting or attenuating phase shifting material 60 provide a 180° phase shift for light used to expose the positive radiation sensitive layer. As is known to those skilled in the art this phase shift provides regularly spaced dark and light lines. The light lines provide the light to expose the positive radiation sensitive layer.

Figure 15:
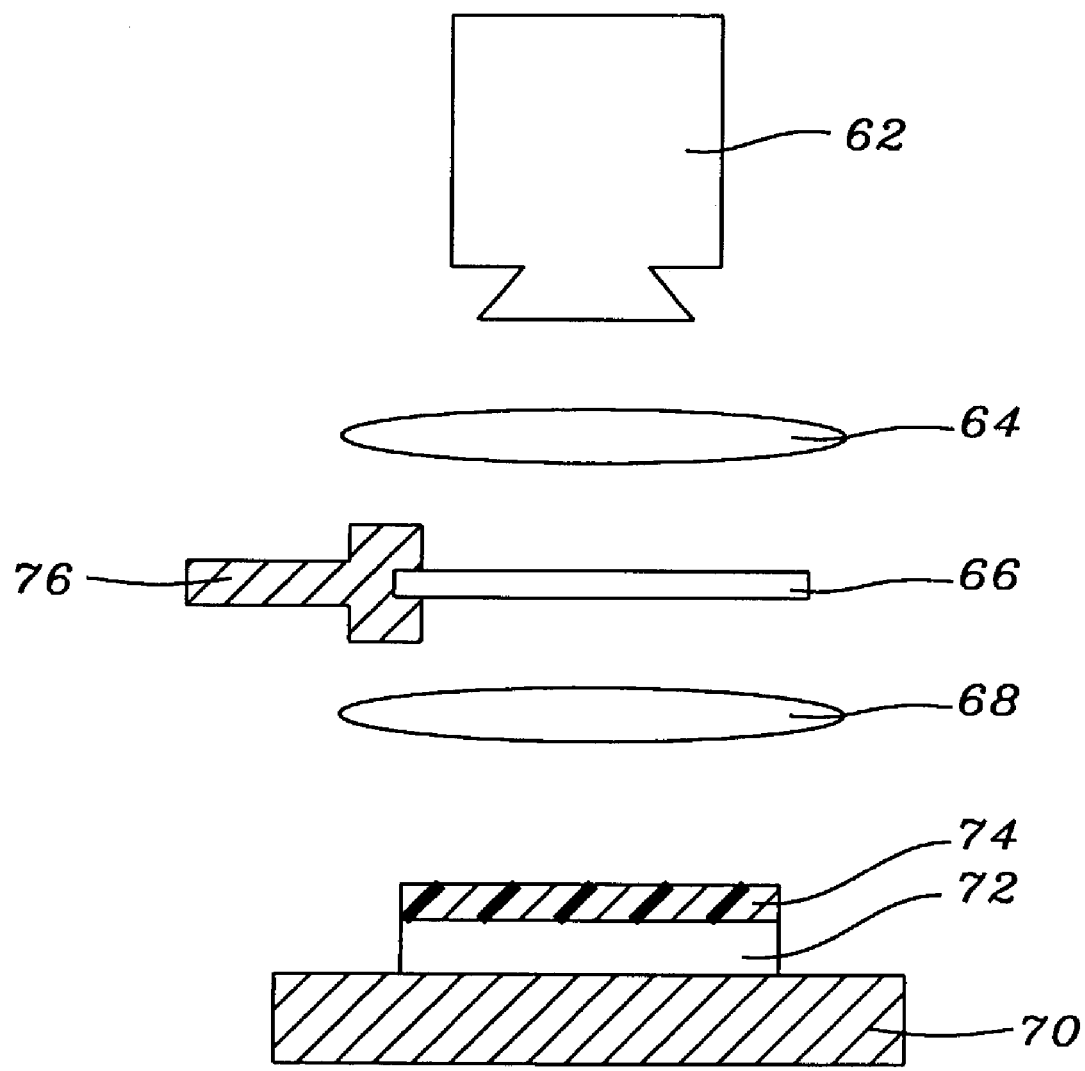
FIG. 15 shows a schematic view of a projection exposure system.

FIG. 15 shows a schematic view of a projection exposure system used to expose the radiation sensitive layer. The system comprises a light source 62, a condensing lens 64, an objective lens 68, a mask holder 76, and a substrate holder 70. A substrate 72 with a positive radiation sensitive layer 74 is placed on the substrate holder. A mask 66 is placed in the mask holder 76. Light passing through the mask 66 is focused by the objective lens 68 to focus the pattern in the mask 66 on the positive radiation sensitive layer 74. The projection exposure system can provide either on-axis or off-axis illumination.

Figure 1B:
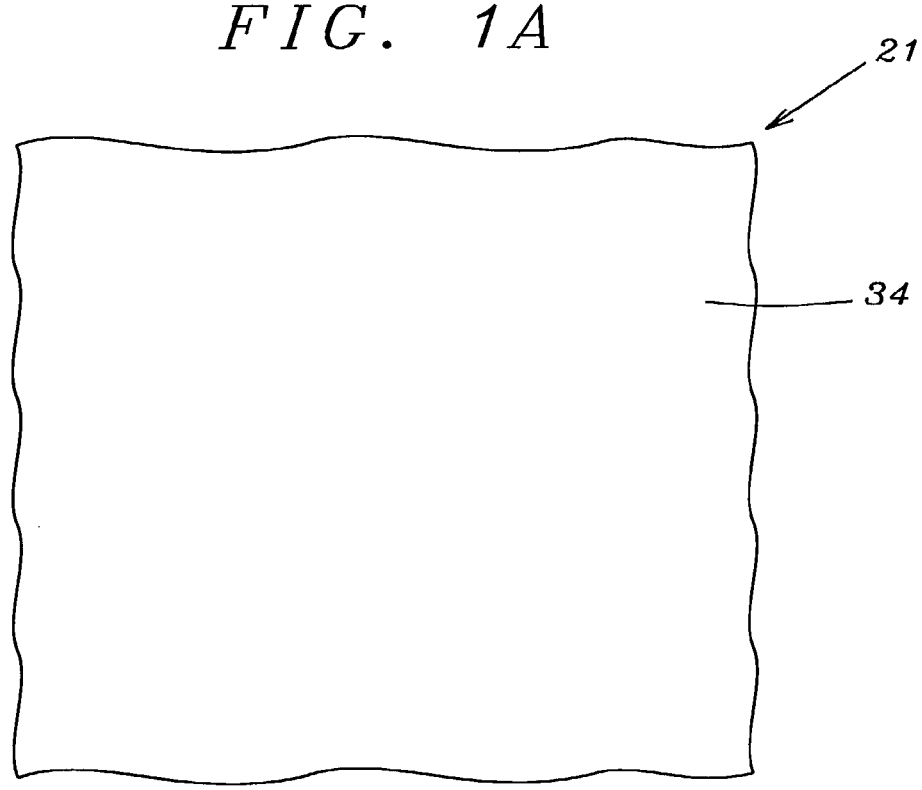
FIG. 1B shows a top view of a substrate having a positive or a negative radiation sensitive layer formed thereon.
Figure 1C:
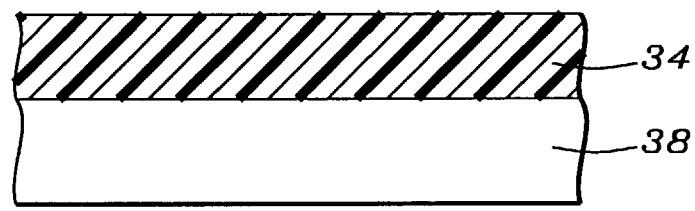
FIG. 1C shows a cross section view of the substrate of FIG. 1B having a positive or a negative radiation sensitive layer formed thereon.

Refer now to FIGS. 1A–1C and 9–15 for another preferred embodiment of the method of forming contact holes of this invention. This embodiment describes the formation of contact holes in a negative radiation sensitive layer. FIG. 1A shows a top view of a pattern of contact holes 20 which is to be formed in a layer of radiation sensitive layer. The contact holes 20 are typically square and are arranged in an array of horizontal and vertical lines. FIG. 1B shows a top view and FIG. 1C a cross section view of a layer of radiation sensitive layer 34 formed on a substrate 38. In this embodiment the radiation sensitive layer 34 is a negative radiation sensitive layer, such as negative photoresist. The substrate 38 typically is a semiconductor integrated circuit wafer having devices formed therein.

Figure 9:
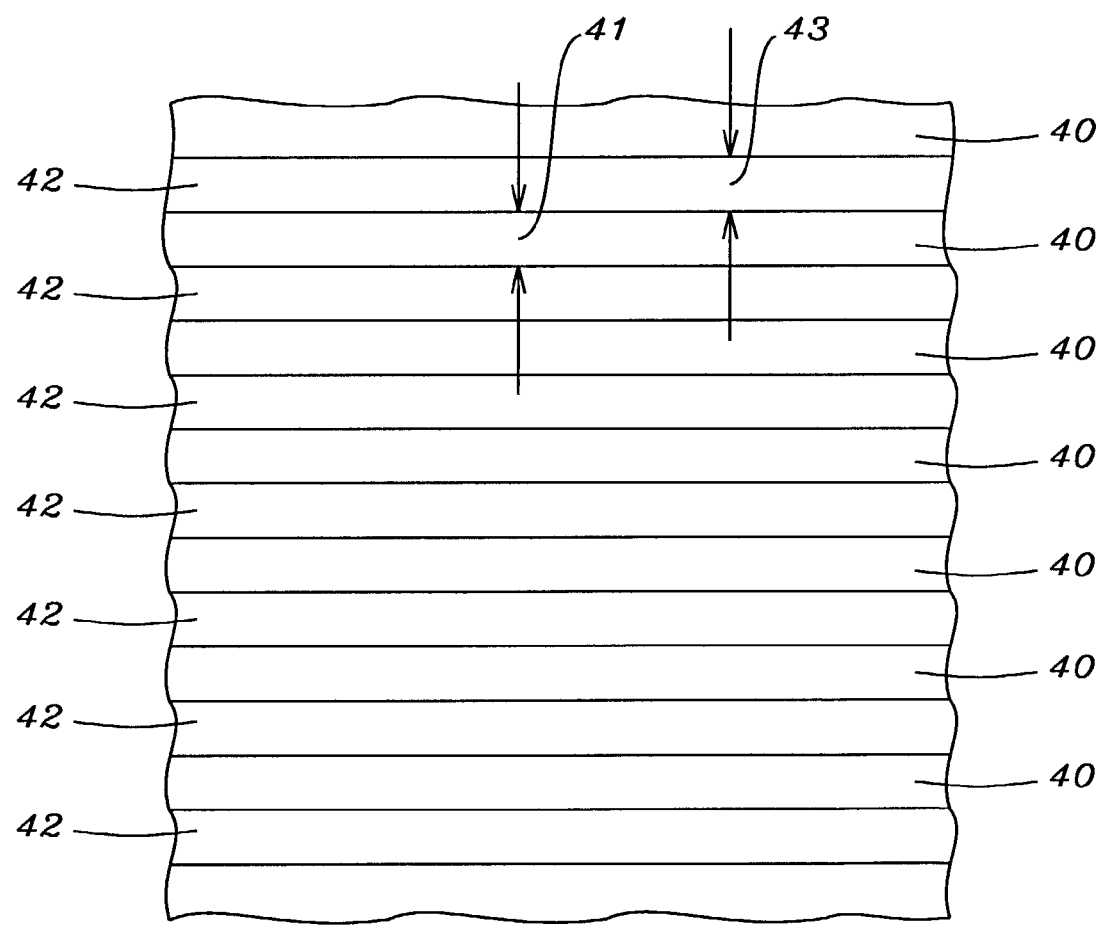
FIG. 9 shows a pattern for a first array of parallel regularly spaced lines used in forming contact holes in a negative radiation sensitive layer.

The method of this invention comprises three exposure steps which will be described in a particular sequence. However, the three exposure steps to be described can be carried out in any sequence. A first exposure step is to expose a first array of parallel regularly spaced lines in the negative radiation sensitive layer using a first exposure dose wherein the first exposure dose is less than that required to expose the entire thickness of the negative radiation sensitive layer. In this example the first exposure dose is equal to one third that required to expose the entire thickness of the negative radiation sensitive layer. FIG. 9 shows the first exposure. In FIG. 9 first lines 40 show the exposed regions in the negative radiation sensitive layer and second lines 42 show unexposed regions lines in the negative radiation sensitive layer. In the first exposure the width 43 of the unexposed second lines 42 is a first width. The spacing 41 between adjacent unexposed second lines 42 is also the first width. In this example the first width is between about 100 and 140 nanometers.

In the first exposure one of the unexposed second lines 42 covers the desired location of each of the contact holes to be formed in the negative radiation sensitive layer. Thus, in the first exposure, the negative radiation sensitive layer at the desired location of each of the contact holes remains unexposed. The exposed regions of the negative radiation sensitive layer are exposed with a first exposure dose. In this example the first exposure dose is one third that required to expose the entire negative radiation sensitive layer.

Figure 10:
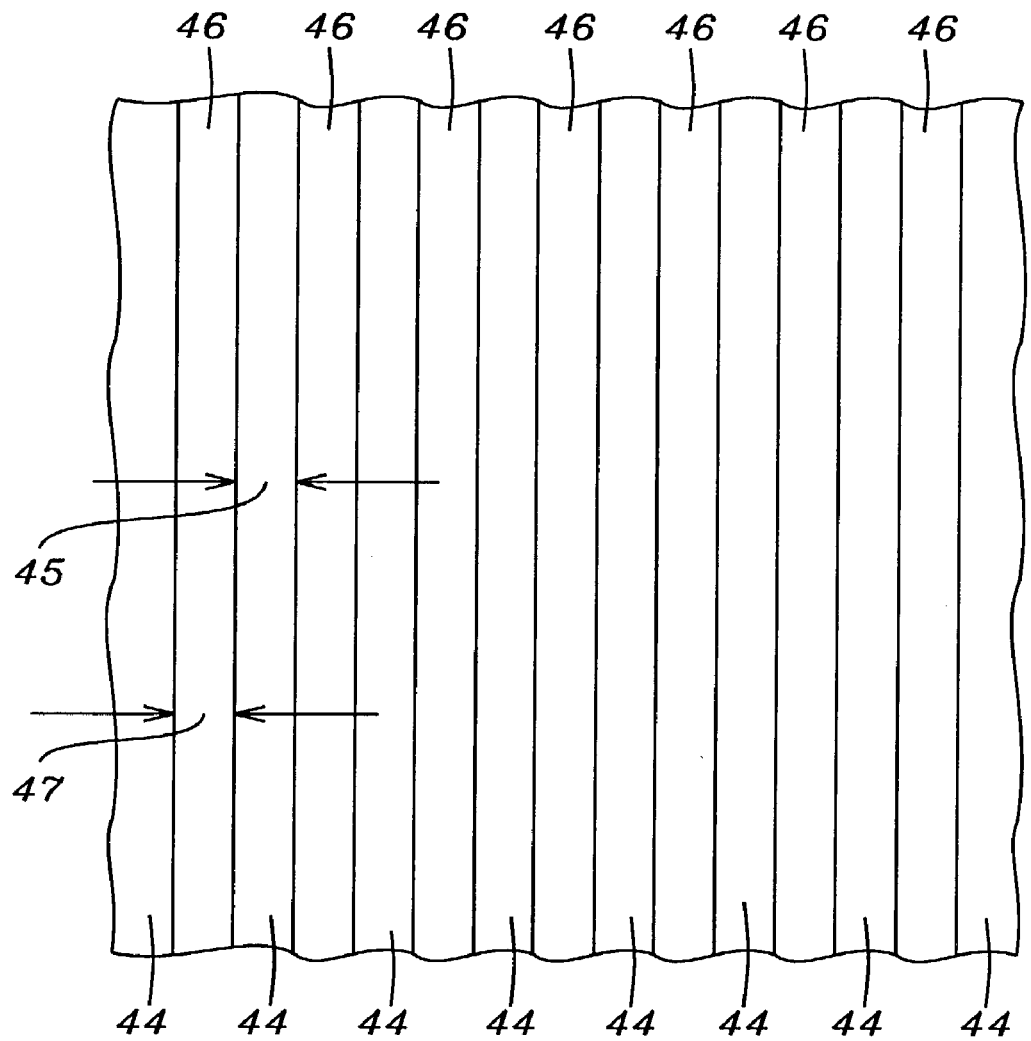
FIG. 10 shows a pattern for a second array of parallel regularly spaced lines used in forming contact holes in a negative radiation sensitive layer.

A second exposure step is to expose a second array of parallel regularly spaced lines using a second exposure dose wherein the second exposure dose is less than that required to expose the entire thickness of the negative radiation sensitive layer. In this example the second exposure dose is equal to one third that required to expose the entire thickness of the negative radiation sensitive layer. FIG. 10 shows the results of the second exposure, where third lines 44 show the exposed regions in the negative radiation sensitive layer and fourth lines 46 show the unexposed regions in the negative radiation sensitive layer. The second lines 42 of the first array of parallel regularly spaced lines intersect the fourth lines 46 of the second array of parallel regularly spaced lines forming an intersection point at each of the desired locations of the contact holes. In the second exposure the width 47 of the unexposed second lines 46 of the negative radiation sensitive layer is a second width. The spacing 45 between adjacent unexposed second lines 46 in the negative radiation sensitive layer is also the second width. Typically, but not necessarily, the first width and the second width are the same. In this example the second width is between about 100 and 140 nanometers.

In the second exposure one of the unexposed vertical lines covers the desired location of each of the contact holes to be formed in the negative radiation sensitive layer. Thus, in the second exposure, the negative radiation sensitive layer at the desired location of each of the contact holes is unexposed. The exposed regions of the negative radiation sensitive layer are exposed with a second exposure dose. In this example the second exposure dose is one third that required to expose the entire negative radiation sensitive layer.

After the first and second exposures the regions corresponding to the desired location of the contact holes have received no exposure while regions surrounding the desired locations of the contact holes have received either the first exposure dose, the second exposure dose, or the sum of the first and second exposure doses.

In a third exposure step the regions of the negative radiation sensitive layer covering the desired location of each contact hole is to remain unexposed and the remainder of the negative radiation sensitive layer is to be sufficiently exposed to expose the entire thickness of the negative radiation sensitive layer. This is accomplished using the mask shown in FIGS. 11A and 11B and a third exposure dose wherein the third exposure dose is the greater of the difference between the exposure dose required to expose the entire thickness of the negative radiation sensitive layer and the first exposure dose, or the difference between the exposure dose required to expose the entire thickness of the negative radiation sensitive layer and the second exposure dose. In this example the third exposure dose is two thirds the exposure dose required to expose the entire thickness of the negative radiation sensitive layer.

Figure 11A:
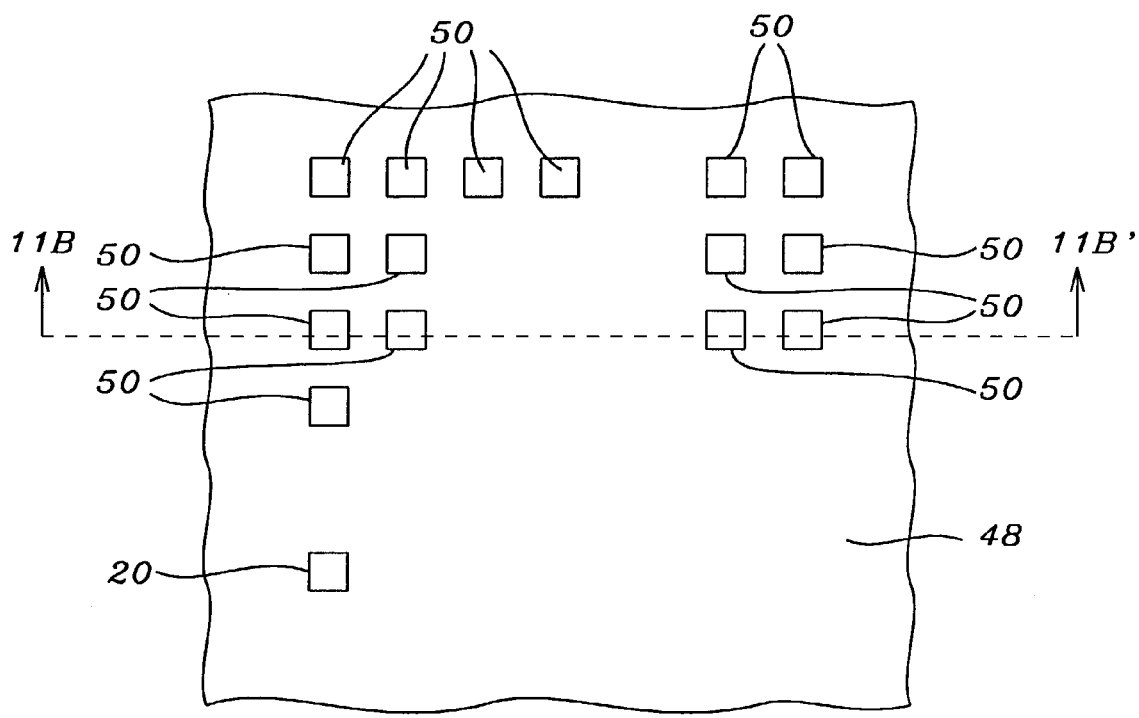
FIG. 11A shows the top view of the binary mask used in the third exposure in forming contact holes in a negative radiation sensitive layer.
Figure 11B:
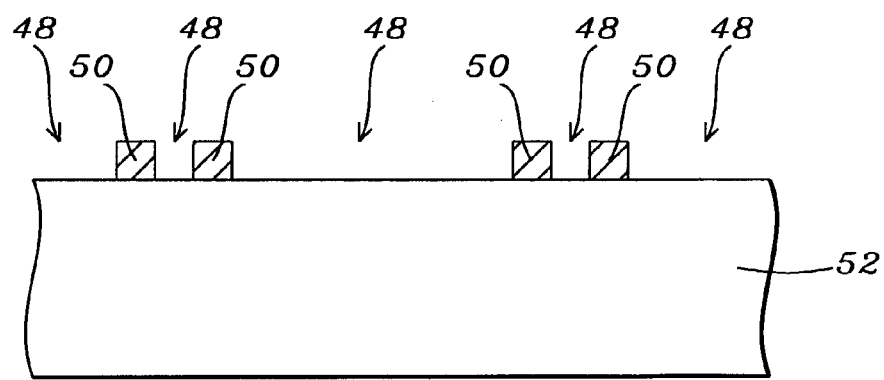
FIG. 11B shows a cross section view, taken along line 11B—11B' of FIG. 11A, of the binary mask used in the third exposure in forming contact holes in a negative radiation sensitive layer.

As shown in FIGS. 11A and 11B the mask used in the third exposure has opaque regions 50 at the desired location of the contact holes. These opaque regions can be slightly smaller than the contact holes but can not be larger, so that the entire region of the negative radiation sensitive layer outside the desired location of the contact holes is fully exposed. Since the opaque regions can be slightly smaller than the regions of the contact holes, because the contact hole regions have received no exposure in the first and second exposure steps and the third exposure step is two thirds that required to expose the negative radiation sensitive layer, the dimensional control for the mask used in the third exposure is not critical and a binary mask is used. FIG. 11A shows the top view of the mask used for the third exposure showing opaque regions 50 used to prevent the exposure of the regions of the negative radiation sensitive layer covering the desired location of each contact hole and a transparent region 48 used to expose the remaining area of the negative radiation sensitive layer. FIG. 11B shows a cross section of the mask used in the third exposure taken along line 11B—11B' of FIG. 11A. As shown in FIG. 11B opaque material 50, such as chrome, is formed on a transparent mask substrate 52. The third exposure uses an exposure dose of two thirds that required to expose the entire negative radiation sensitive layer.

Figure 12A:
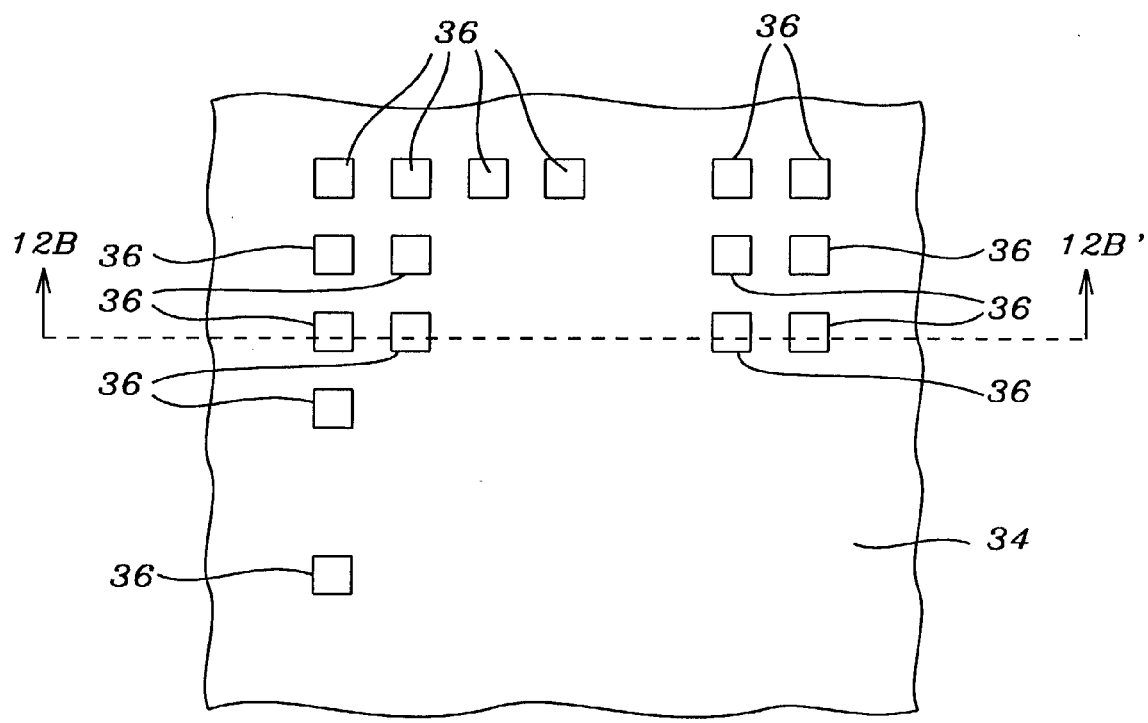
FIG. 12A shows a top view of the exposed and developed negative radiation sensitive layer.
Figure 12B:
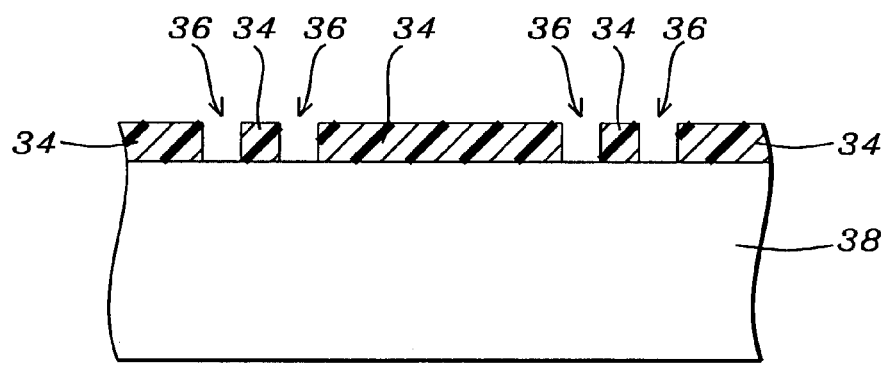
FIG. 12B shows a cross section view, taken along line 12B—12B' of FIG. 12A, of the exposed and developed negative radiation sensitive layer.

The three exposures leaves the negative radiation sensitive layer over most of the desired location of each of the contact holes unexposed, however some of the edges of the contact holes may be exposed, but with an exposure dose less than that required to expose the entire thickness of the radiation sensitive layer. Every other region of the layer of radiation sensitive layer receives an exposure dose sufficient to expose the entire layer of radiation sensitive layer. The first, second, and third exposures can be preformed in any order. As shown in FIGS. 12A and 12B, the negative radiation sensitive layer 34 is then developed to form the contact holes 36. FIG. 12B shows a cross section view of the substrate 38 and negative radiation sensitive layer 34 after the negative radiation sensitive layer has been developed and the contact holes 36 have been formed. FIG. 12B is a cross section view taken along line 12B—12B' of FIG. 12A. The negative radiation sensitive layer can be negative photoresist.

The masks used to form the first array pattern of the first exposure and the second array of the second exposure can be binary masks, chrome-less phase shifting masks, or attenuating phase shifting masks with off-axis illumination, attenuating phase shifting masks with conventional on-axis illumination or two beam interferences. FIG. 13 shows a cross section view of a binary mask used in the first and second exposures showing regularly spaced opaque lines 56 on a transparent mask substrate 54. The opaque lines 56 can be formed of an opaque material such as chrome. FIG. 14 shows a cross section view of a phase shifting mask or an attenuating phase shifting mask. For these masks regularly spaced lines of phase shifting or attenuating phase shifting material 60 is formed on a transparent mask substrate 58. The lines of phase shifting or attenuating phase shifting material 60 provide a 180° phase shift for light used to expose the negative radiation sensitive layer. As is known to those skilled in the art this phase shift provides regularly spaced dark and light lines. The light lines provide the light to expose the negative radiation sensitive layer.

FIG. 15 shows a schematic view of a projection exposure system used to expose the radiation sensitive layer. The system comprises a light source 62, a condensing lens 64, an objective lens 68, a mask holder 76, and a substrate holder 70. A substrate 72 with a negative radiation sensitive layer 74 is placed on the substrate holder. A mask 66 is placed in the mask holder 76. Light passing through the mask 66 is focused by the objective lens 68 to focus the pattern in the mask 66 on the negative radiation sensitive layer 74. The projection system can provide on axis or off axis illumination.

The methods of this invention use a dense line and space pattern to form contact holes. This method provides better depth of focus latitude and exposure dose latitude. This provides an improved process window for the formation of the contact holes.

While the invention has been particularly shown and described with reference to the preferred embodiments thereof, it will be understood by those skilled in the art that various changes in form and details may be made without departing from the spirit and scope of the invention.

What is claimed is:

1. A method of forming patterns in a radiation sensitive layer, comprising:
    providing a positive radiation sensitive layer on a substrate;
    exposing a first periodical pattern in said radiation sensitive layer;
    exposing a second periodical pattern in said radiation sensitive layer to form regions with different exposure degree; and
    exposing at least one intersection of said first and second periodical patterns in said radiation sensitive layer to expose the entire thickness of said radiation sensitive layer.

2. The method of claim 1 wherein said first periodical pattern and said second periodical pattern form a plurality of intersecting points and each of said intersecting points covers a desired location of a contact hole.

3. The method of claim 1 further comprising developing said radiation sensitive layer.

4. The method of claim 1 wherein said radiation sensitive layer is a layer of photoresist.

5. The method of claim 1 wherein said exposing said first periodical pattern and exposing said second periodical pattern uses binary masks.

6. The method of claim 1 wherein said exposing said first periodical pattern and exposing said second periodical pattern uses phase shifting masks.

7. The method of claim 1 wherein said exposing said first periodical pattern and exposing said second periodical pattern uses a projection exposure system.

8. The method of claim 1 wherein said exposing said first periodical pattern and exposing said second periodical pattern uses a projection exposure system, off-axis illumination, and attenuating phase shifting masks.

9. A method of forming contact holes in a radiation sensitive layer, comprising:
    providing a substrate;
    providing a positive radiation sensitive layer formed on said substrate wherein a number of contact holes are to be formed in said positive radiation sensitive layer;
    exposing a first series of parallel regularly spaced lines in said positive radiation sensitive layer using a first exposure dose, wherein said first exposure dose is less than that required to fully expose said positive radiation sensitive layer;
    exposing a second series of parallel regularly spaced lines in said positive radiation sensitive layer using a second exposure dose, wherein said second exposure dose is less than that required to fully expose said positive radiation sensitive layer, said second series of parallel regularly spaced lines intersect said first series of parallel regularly spaced lines to form a plurality of intersecting points, and one of said intersecting points covers the desired location of each of said contact holes;
    exposing said positive radiation sensitive layer at the location of said intersecting points using a third exposure dose, wherein the exposure dose required to fully expose said positive radiation sensitive layer is equal to the sum of said first exposure dose, said second exposure dose, and said third exposure dose; and
    developing said positive radiation sensitive layer thereby forming said contact holes in said positive radiation sensitive layer.

10. The method of claim 9 wherein said exposing said positive radiation sensitive layer at the location of said intersecting points using a third exposure dose uses binary masks comprising patterned opaque material on a transparent mask substrate.

11. The method of claim 9 wherein said positive radiation sensitive layer is positive photoresist.

12. The method of claim 9 wherein the width of the lines and the spaces between adjacent lines in said first series of parallel regularly spaced lines are between about 100 and 140 nanometers.

13. The method of claim 9 wherein the width of the lines and the spaces between adjacent lines in said second series of parallel regularly spaced lines are between about 100 and 140 nanometers.

14. The method of claim 9 wherein said exposing said first series of parallel regularly spaced lines and exposing said second series of parallel regularly spaced lines uses a projection exposure system.

15. The method of claim 9 wherein said exposing said first series of parallel regularly spaced lines and exposing said second series of parallel regularly spaced lines uses a projection exposure system, off-axis illumination, and an attenuating phase shifting mask.

16. The method of claim 9 wherein said exposing said first series of parallel regularly spaced lines and exposing said second series of parallel regularly spaced lines uses phase shifting masks.

17. The method of claim 9 wherein said exposing said first series of parallel regularly spaced lines and exposing said second series of parallel regularly spaced lines uses binary masks.

* * * * *